United States Patent [19]

Keeley

[11] Patent Number: 4,575,792
[45] Date of Patent: Mar. 11, 1986

[54] SHARED INTERFACE APPARATUS FOR TESTING THE MEMORY SECTIONS OF A CACHE UNIT

[75] Inventor: James W. Keeley, Hudson, N.H.

[73] Assignee: Honeywell Information Systems Inc., Waltham, Mass.

[21] Appl. No.: 364,051

[22] Filed: Mar. 31, 1982

[51] Int. Cl.[4] .................. G06F 11/00; G06F 13/00
[52] U.S. Cl. .................................. 364/200; 371/21
[58] Field of Search ... 364/200 MS File, 900 MS File; 371/21

[56] References Cited

U.S. PATENT DOCUMENTS 4,167,779  9/1979  Sullivan et al. ............... 364/200
4,190,885  2/1980  Joyce et al. .................. 364/200
4,357,656  11/1982 Saltz et al. ................... 364/200
4,392,201  7/1983  Brown et al. ................. 364/200

Primary Examiner—Eddie P. Chan
Attorney, Agent, or Firm—Faith F. Driscoll; John S. Solakian

[57] ABSTRACT

The circuits of a cache unit constructed from a single board are divided into a cache memory section and a controller section. The cache unit is connectable to the central processing unit (CPU) of a data processing system through the interface circuits of the controller section. Test mode logic circuits included within the cache memory section enable cache memories to be tested without controller interference utilizing the same controller interface circuits.

31 Claims, 8 Drawing Figures

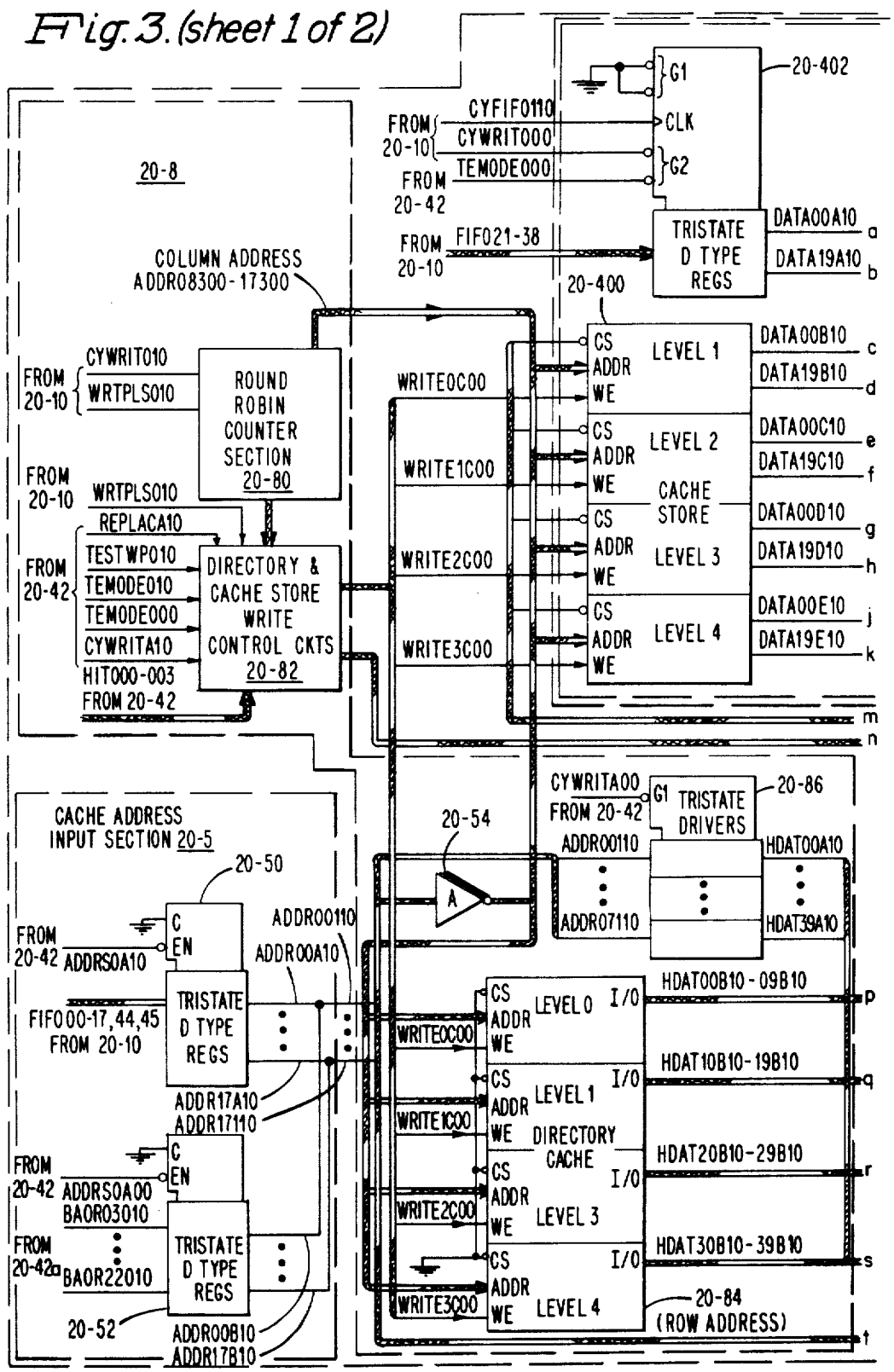
Fig. 3. (sheet 1 of 2)

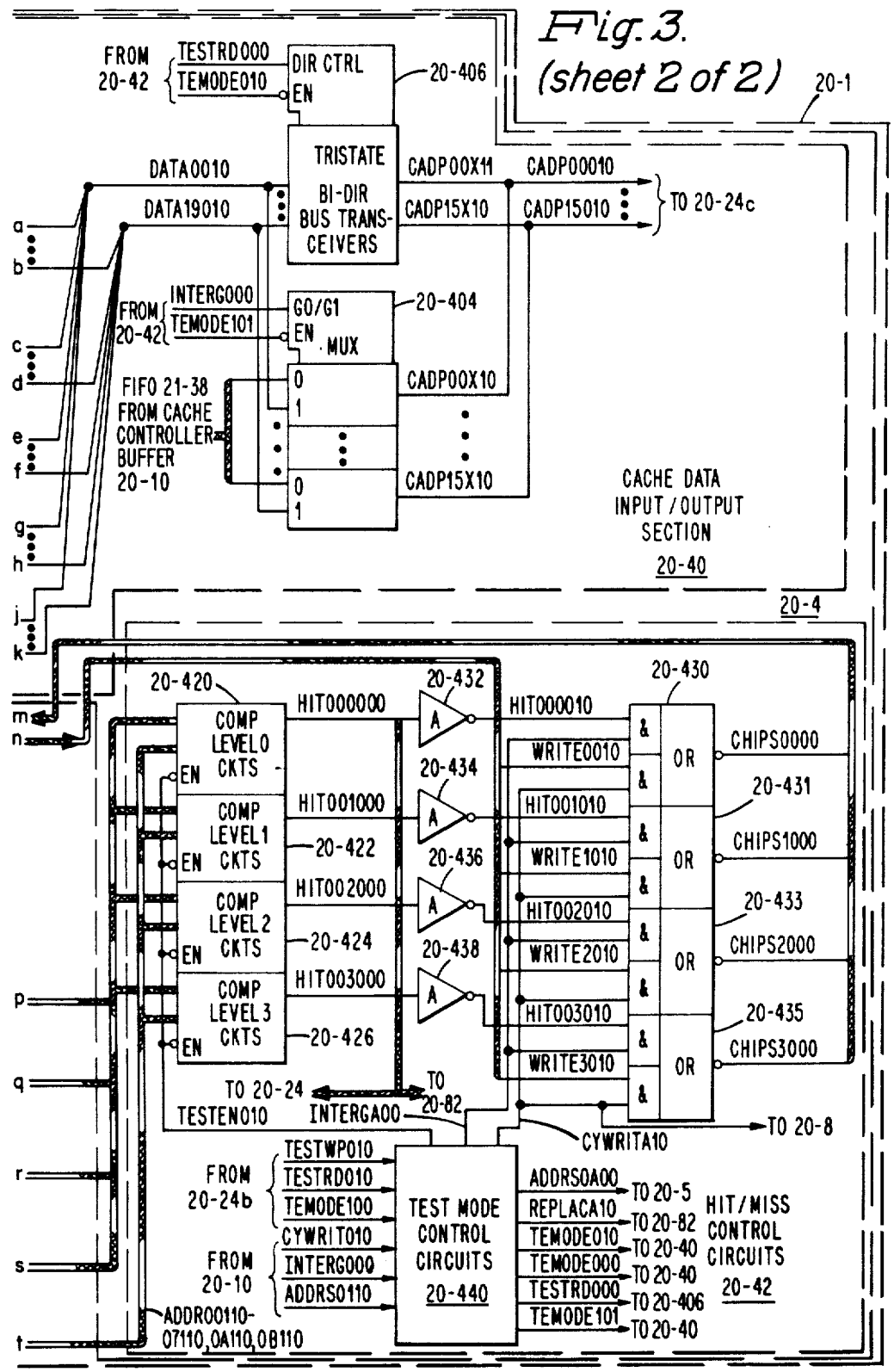

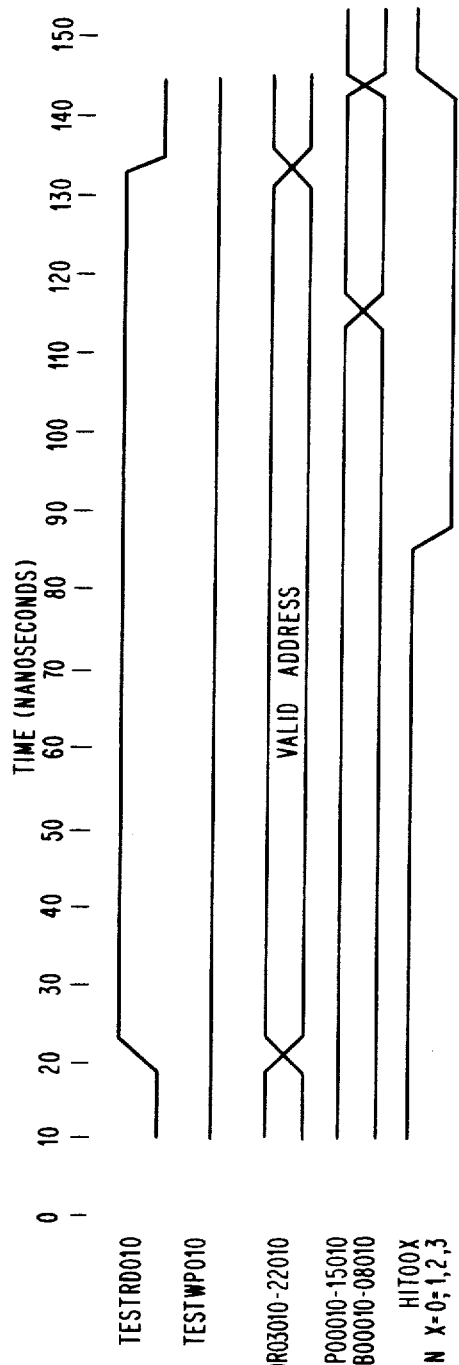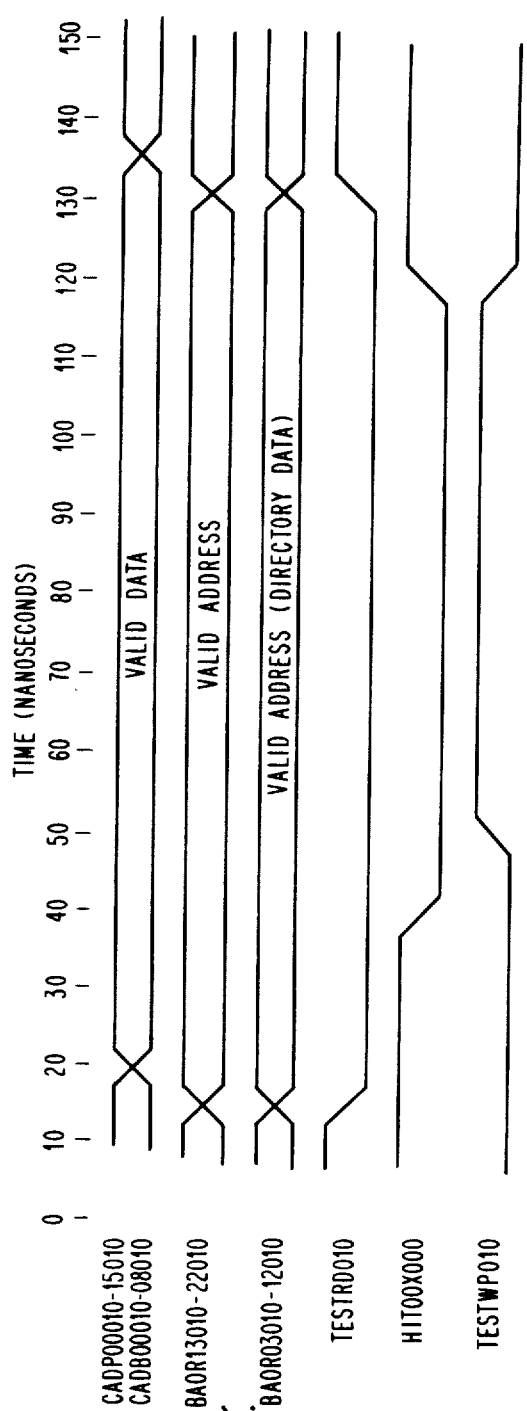

SHARED INTERFACE APPARATUS FOR TESTING THE MEMORY SECTIONS OF A CACHE UNIT

BACKGROUND OF THE INVENTION

1. Field of Use

The present invention relates to the testing of data processing systems and more particularly to the testing of cache systems.

2. Prior Art

It is well known in the art to provide cache units between a central processing unit (CPU) and a main store to improve overall system performance. However, since the cache unit is normally invisible to the operating system software during normal operation, errors or faults occurring within the cache unit are not detectable by such software. That is, when the cache is unable to provide correct data in response to a CPU request, the cache unit fetches the data from main store. This results in decreased system performance.

In view of the above, it becomes difficult to diagnose whether or not the cache unit is operating properly. In the past, elaborate software diagnostic routines were employed for testing cache operation which involved transferring information from main store to cache for comparison with such known information when read from cache. In order to eliminate the need for such elaborate software, one system arrangement enables the cache unit to be placed in a test and verification mode of operation wherein hardware faults can be signalled to the CPU. This arrangement is described in U.S. Pat. No. 4,190,885 issued Feb. 26, 1980 and is assigned to the same assignee as named herein.

While the above arrangement overcomes the prior art problems, it has been found that such test and verification operations are able to indirectly test certain portions of the cache unit. That is, while test and verification routines test or exercise various portions of the cache, the control of cache operations still resides with the cache unit. This can interfere with such testing making it difficult in certain instances to detect faults occurring within the cache memory portions.

In order to minimize the likeliness of the occurrence of faults within cache memory portions, factory and on-site test equipment and procedures are employed. Such procedures often employ in part the same diagnostic routines used by the CPU to test cache operation. An important difference is that in partitioned designs, cache unit can be disassembled to some extent during such testing thereby enabling independent testing of cache memory portions. Because of cost disadvantages, it becomes desirable to employ more integrated designs in which all the circuits of a cache unit are placed on a single board. Accordingly, it is no longer possible to independently test cache memory portions. Furthermore, it becomes more difficult to define interfaces between the different cache portions.

To overcome the above problems, one approach is to employ special interfaces and associated logic circuits for testing. Another approach is to use a "bed of nails" tester. The bed of nails tester probes the underside of a board to make available a larger number of points for observation and control. A disadvantage of this approach is that the tester must have enough test points to be able to control and observe each one of the nails or points. Further, the software for carrying out such tests is exceedingly complicated to generate and runs too slow to effectively test high speed memories.

Also, the mechanical fixtures required to hold the bed of nails are expensive to construct and difficult to align so that the normal forces on the probes are sufficient to guarantee reliable contacts. Also, when used for such testing, it becomes necessary to drive certain chip circuits to abnormal states in order to properly isolate different cache portions from each other for independent testing. However, it has been found that there is still some risk of incomplete testing of inter-connections and that substantial care must be taken to ensure that such circuits are not damaged from being overdriven.

Accordingly, it is a primary object of the present invention to provide testing apparatus which facilitates the detection of faults within the circuits of a cache unit constructed on a single board without causing damage to such circuits.

It is a further object of the present invention to provide testing apparatus which improves the detection of faults within the memory portions of a cache unit of single board construction.

It is still a further object of the present invention to provide apparatus for testing the circuits of a cache unit of single board construction prior to installation within a data processing system.

SUMMARY OF THE INVENTION

The above objects and advantages are achieved in a preferred embodiment of a cache unit constructed on a single board. The cache unit is divided into two basic sections, a controller section and a memory section. The controller section includes the circuits for controlling the overall operations and maintaining status information within the different portions of the cache unit. This section includes interface circuits which when the cache unit board is installed in a data processing system, connect the cache unit to the system's central processing unit (CPU). The memory section includes the directory and cache store memories which store memory addresses and data.

In accordance with the teachings of the present invention, apparatus is included in the cache unit which enables cache memories to be tested without interference from the controller section utilizing the same controller interface circuits used by the CPU during normal operations. Such apparatus includes test mode selection circuits which couple to the controller interface circuits and input/output selector circuits which couple to the cache store circuits. When the cache unit is placed in a test mode or configured for testing, signals are applied to specific points within the controller circuits and cache memories, and the input/output selector circuits which effectively isolate the cache memories from controller operation and permit memory operation to be controlled by signals applied to the interface circuits. Additionally, the interface circuits connect to the hit output lines of the hit comparison circuits within the cache memory section. During testing, these lines are used for controlling write operations and monitoring read operations.

From the above, it is seen that the present invention through a minimum of additional logic circuits is able to directly test and verify the operation of memory circuits within a cache unit. When such testing takes place prior to the installation of the cache board within the data processing system, the interface circuits are connected to a test interface which, in turn, couples to automatic test equipment. For the purposes of the present invention, such test equipment can be conventional in design. It primarily operates to generate the appropriate sequences of address data and hit level patterns under various conditions required for detecting the presence of any errors or faults within the cache memories. Such conditions include acceptable variations in power supply voltages, temperature and humidity.

When such testing is to take place and the cache board is installed within the system, the interface circuits couple to a system CPU responsible for testing. Accordingly, it is the CPU which now generates the sequences of address, data and hit level patterns for detecting the presence of any errors or faults within the cache memories. By being able to directly test the cache memory section, the test and verification procedures and routines heretofore utilized to test the overall operation of the cache unit can be simplified and made specific. More importantly, the invention permits more accurate detection of memory errors and faults.

The novel features which are believed to be characteristic of the invention both as to its organization and method operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIG. 3 is a block diagram of the cache unit of FIG. 1.

FIGS. 5 and 6 are timing diagrams used to explain the operation of the apparatus of the present invention.

DESCRIPTION OF THE PREFERRED EMBODIMENT

Figure 1:
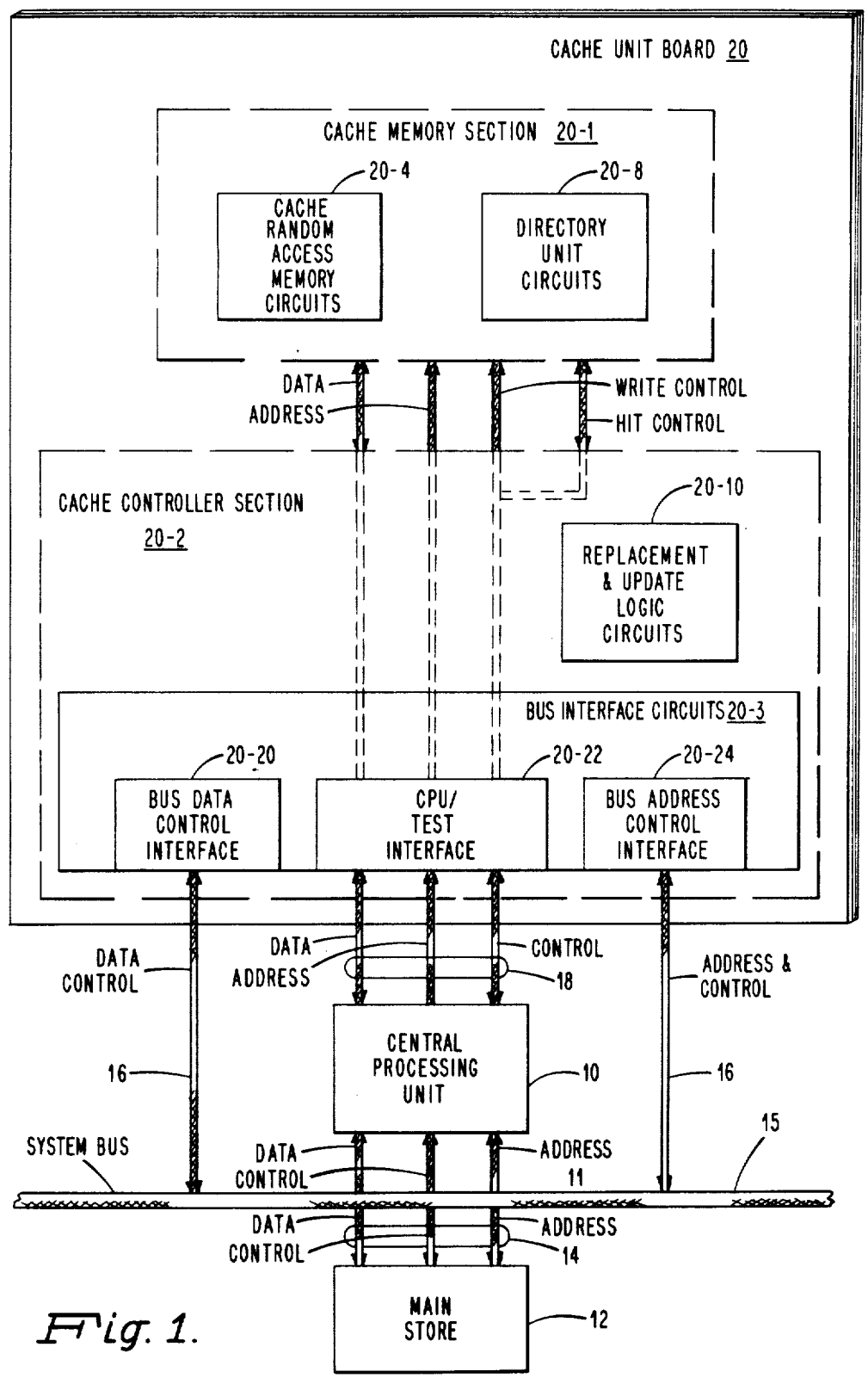
FIG. 1 is a block diagram of a minicomputer system which includes the cache unit testing apparatus of the present invention.

Referring to FIG. 1, it is seen that the minicomputer system includes a central processing unit (CPU) 10, a main store 12 and a cache unit 20. As shown, the CPU 20, main store 10 and cache unit 20 couple to a system bus 15 via address control and data lines of bus interfaces 11, 14 and 16, respectively. Additionally, CPU 10 and cache unit 20 are interconnected through the address, control and data lines of a private interface 18.

For the purposes of the present invention, CPU 10 and main store 12 may be considered conventional in design. Main store 12 is an MOS memory which can include up to 1,048,576 words organized in 1,024 rows by 1,024 columns. For example, CPU 10 and main store 10 may take the form of the CPU and main memory described in U.S. Pat. No. 4,195,343 issued Mar. 25, 1980, assigned to the assignee named herein. Also, they may take the form of the units included in the Series 60 Level 6 Model 40 minicomputer manufactured by Honeywell Information Systems Inc.

The cache unit 20 provides high speed access to processor data and instructions which have been previously used or are expected to be used (e.g. prefetched). In general, CPU 10 requests data words and instructions via private interface 18. When the requested word is in cache, the cache unit 20 transfers the requested word over the interface 18. When the requested word is not stored in cache, cache unit 20 fetches the word from main store 12 over system bus 15 and transfers it to CPU 20 via private interface 18.

The cache unit 20 includes two major sections, cache controller section 20-2 and a cache memory section 20-1. The cache controller section 20-2 includes bus interface circuits of block 20-3 and the replacement and update logic circuits of block 20-10. The replacement logic section 20-10 includes the circuits which control access to main store 12 for fetching data or instructions requested by CPU 10 which were not found in cache RAM circuits 20-1. Also, it includes logic circuits for storing information received from main store 12 in both the cache RAM circuits 20-4 and directory section 20-8 during replacement and update operations.

The bus interface circuits 20-3 include bus control circuits and connectors of blocks 20-20 and 20-24 for enabling the cache unit 20 to access main store 12 through asynchronous system bus 15 for fetching data and instructions in response to requests from CPU 10. Additionally, the connectors of blocks 20-20 and 20-24 receive the required DC power supply voltage and ground reference signals required for operating the cache unit 20. For further information regarding these circuits and interface connections, reference may be made to U.S. Pat. Nos. 3,933,981, 4,030,075, 4,190,885 and 4,195,343.

Additionally, the bus interface circuits 20-3 include the interface circuits of block 20-22 which transfer requests for data words and instructions through private interface 18. As explained herein, the interface circuits of block 20-22 together with logic circuits included within cache unit 20 enable direct testing of cache memory section 20-1 in accordance with the teachings of the present invention. The interface circuits of block 20-22 will now be considered in greater detail.

CPU/TEST INTERFACE 20-22

Figure 2:
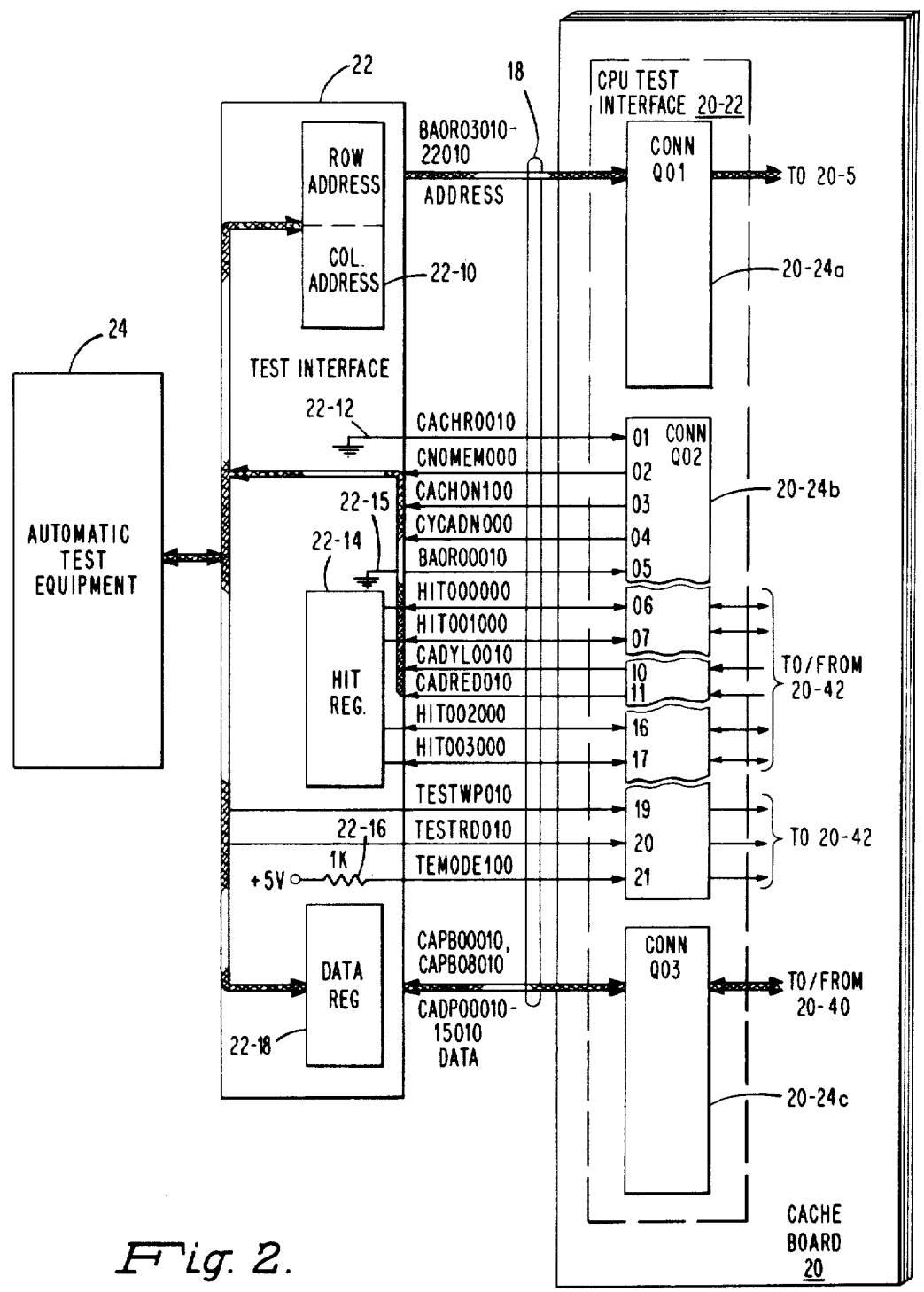
FIG. 2 is a block diagram of the arrangement employed for testing a cache unit board including the apparatus of the present invention prior to being installed in the minicomputer system of FIG. 1.

This interface is shown in greater detail in FIG. 2. As mentioned previously, the interface 20-22 includes the connectors 20-24a, 20-24b and 20-24c.

The signals listed below are included in the cache/CPU interface 20-22 constructed in accordance with the principles of the present invention. The asterisk symbol denotes those signals which are controlled during testing.

| CONNECTOR | NO. OF LINES | TYPE | SIGNAL NAME | DESCRIPTION |
| --- | --- | --- | --- | --- |
| Q1 | 20 | ADDRESS | *BAOR03010-22010 | These signals are controllable during testing |

-continued

| CONNECTOR | NO. OF LINES | TYPE | SIGNAL NAME | DESCRIPTION |
|---|---|---|---|---|
| | | | | and represent the address (row and column) applied to the cache store and directory memories. |
| Q2 | 1 | CONTROL (CACHE REQUEST) | CACHRQ010 | This signal indicates when address signals BAOR03010 through BAOR22010 are valid. During testing, this signal is forced to a binary ZERO. |
| Q2 | 1 | CONTROL | CNOMEMD00 | This signal indicates that the memory address is out of bounds. |
| Q2 | 1 | CONTROL | CACHON100 | When a binary ZERO, this signal indicates that the cache unit is on line. |
| Q2 | 1 | CONTROL (CACHE DONE) | CYCADN000 | This signal indicates when the data signals CADP00010 through CADP15010, CAPB00010 and CAPB08010 being transferred to the CPU is valid. |
| Q2 | 1 | CONTROL | BAOR00010 | This signal indicates an illegal memory reference and causes a no hit condition to occur. In such instances, the data is fetched from main store, transferred to the CPU along with a memory out of bounds signal CNOMEM000, but is not stored in cache. During test mode, this signal is placed in a binary ZERO state. |
| Q2 | 2 | ERROR INDICATOR | CADYL0010 CADRED010 | These signals denote the occurrence of single and multiple errors and are not valid during test mode. |
| Q2 | 1 | TEST CONTROL | TEMODE100 | This signal is forced to a binary ONE which places cache unit 20 in test mode. |
| Q2 | 1 | TEST CONTROL | *TESTRD010 | During testing, when this signal is forced to a binary ONE, it specifies a read operation. When |

-continued

| CONNECTOR | NO. OF LINES | TYPE | SIGNAL NAME | DESCRIPTION |
|---|---|---|---|---|
| | | | | it is a binary ZERO, it specifies a write operation. |
| Q2 | 1 | TEST CONTROL | *TESTWP010 | During testing, this signal generates a write pulse for carrying out a write operation. |
| Q2 | 4 | TEST CONTROL | *HIT000000-003000 | During testing, these signals specify the level selected during a write operation. These signals, during a read operation, indicate the level at which a hit occurred. |
| Q3 | 18 | DATA | *CADP00010-15010, CAPB00010, CAPB08010 | These signals correspond to the cache data which is returned to CPU 10. During testing, these cache data signals are bi-directional and are independent of signal CYCADN000. |

These signals will be described in greater detail herein in connection with FIG. 2.

The cache memory section 20-1 includes the cache random access memory (RAM) circuits of block 20-4 and the directory unit circuits of block 20-8.

The directory section 20-8 determines whether or not the CPU requested word resides in Section 20-4. To accomplish this, the directory section 20-8 as discussed herein includes a 4-level set associative memory.

The cache RAM circuits 20-1 include the high speed storage for CPU data and instructions. It has 4096 words of storage which are organized into four, 1,024 columns of storage. Accordingly, each column of main store 12 has four entries in cache section 20-1 associated therewith.

Cache RAM Section 20-1

FIG. 3 illustrates in block diagram form the units which comprise the memory circuits of blocks 20-4, 20-5 and 20-8 in addition to the circuits which comprise the testing apparatus of the present invention.

As seen from FIG. 3, section 20-4 includes the 4-level cache store 20-40 and hit/miss control circuits of block 20-42. Each level of store 20-40 includes six RAM chips, each chip containing 1024 by 4 bit locations. As seen from FIG. 3, each RAM chip receives column address signals ADDR08200 through ADDR17200 from cache address input section 20-5 after being inverted by a corresponding number of inverter circuits of block 20-54. These signals correspond to the least significant 10 address bits of a main store address (i.e., bits 10-19).

Additionally, the six chips of each level receive a corresponding one of the chip select signals CHIPS0000 through CHIPS3000 from the circuits of block 20-42. When any one of these signals is forced to a binary ZERO, all of the RAM chips of the designated level are enabled for operation.

The RAM levels may be considered conventional in design and may, for example, be constructed from 2149H MOS memory chips manufactured by Intel Corporation.

Lastly, the RAM chips of each level receive a corresponding one of the write enable signals WRITE0C00 through WRITE3C00 from directory section 20-8. When any one of these signals is forced to a binary ZERO, all of the chips of the designated level are enabled for a write operation. The data to be written into the designated level is applied to a set of data in lines as signals DATA00A10 through DATA19A10 which are received from section 20-10 via a plurality of D-type tristate registers of block 20-402.

The source of these data signals is a first in, first out (FIFO) buffer included in section 20-10 which couples to system bus 15 via the interface circuits of blocks 20-20 and 20-24.

The signals from the FIFO buffer are also applied to a first set of inputs of the 2:1 multiplexer/selector circuits of block 20-404. The second set of inputs of the multiplexer circuits of block 20-404 connect to the data I/O terminals of the cache store chips as shown. The multiplexer circuits 20-404 during normal operation transfer to CPU 10 the requested data from cache store 20-400 or from main store via the FIFO buffer as it is being written into cache store 20-400. During normal operation, the state of signal INTERG000 from section 20-10 establishes the source of cache store output data signals CADP00010 through CADP15010 applied to the data output lines of interface connector 20-24c.

In accordance with the teachings of the present invention, the data I/O terminals of cache store 20-400 connect to the tristate bidirectional bus transceiver circuits of block 20-406. During normal operation, these circuits are placed in the tristate mode of operation. At that time, they are effectively disconnected from the system. However, during test mode, as explained herein, these circuits serve as input/output paths between cache store 20-400 and the data lines of interface connector 20-24c.

In the preferred embodiment, the tristate D register circuits of block 20-402 may be constructed from 74173 chips manufactured by Texas Instruments Corporation. The multiplexer circuits of block 20-404 may be constructed from 74S257 chips manufactured by Texas Instruments Corporation. In the preferred embodiment of the present invention, the tristate bidirectional transceiver circuits jmay be constructed from 74LS245 chips also manufactured by Texas Instrument Corporation.

As seen from FIG. 3, the hit/miss control circuits of block 20-42 include four comparator circuits 20-420 through 20-426. These circuits compare the row address signals ADDR00110 through ADDR07110, signal ADDR00A10 and ADDR00B10 from CPU 10 or replacement logic section 20-10 with the address signals read out from a corresponding one of the directory levels (i.e., signals HDAT00B10-09B10, HDAT10B10-19B10, HDAT20B10-29B10 and HDAT30B10-39B10). The row address corresponds to the most significant 10 bits of the main store address (i.e., bits 0-9).

Again, the source of the row address signals ADDR00110 through ADDR07110 is cache address input section 205. Each of the comparator circuits 20-420 through 20-426 generates a corresponding one of the hit signals HIT000000 through HIT003000 indicative of the results of the comparison. The hit signals are applied as inputs to directory section 20-8 and to the select logic circuits of block 20-430. When there is a true or identical comparison, the comparator circuit forces a corresponding one of the hit signals to a binary ZERO. Additionally, in accordance with the teachings of the present invention, the hit signals are applied to predetermined interface lines of connector 20-24b. As explained herein, the hit lines are used during both read and write test operations.

The comparator circuits are conventional in design. For example, each comparator circuit may be constructed from 10 exclusive OR circuits connected to compare each pair of corresponding address bits and a NAND gate connected to receive the outputs of the exclusive OR circuits.

As seen from FIG. 2, signals HIT000000 through HIT003000 are inverted by inverter circuits 20-432 through 20-438 and the output signals HIT000010 through HIT003010 are applied as inputs to the logic circuits of blocks 20-430, 20-431, 20-433 and 20-435. These circuits operate to generate chip enable signals CHIPS0000 through CHIPS3000. These signals are generated in accordance with the following Boolean equations wherein the symbol + represents an OR operation and the symbol . represents an AND operation.

CHIPS0000 =

$$\overline{HIT000010 \cdot INTERGA00 + WRITE0010 \cdot CYWRITA10}$$

CHIPS1000 =

-continued $$\overline{HIT001010 \cdot INTERGA00 + WRITE1010 \cdot CYWRITA10}$$

CHIPS2000 =

$$\overline{HIT002010 \cdot INTERGA00 + WRITE2010 \cdot CYWRITA10}$$

CHIPS3000 =

$$\overline{HIT003010 \cdot INTERGA00 + WRITE3010 \cdot CYWRITA10}$$

The signals INTERGA00 and CYWRITA10 are control signals generated by the test mode control circuits of block 20-440.

During normal operation, signal INTERGA00 is a binary ONE when data is not being applied to bus interface 18 from cache store 20-400 through a 2．1 selector circuit 20-404. Signal CYWRITA10 is forced to a binary ONE during each memory write cycle of operation. For further information regarding the operation of these signals, reference may be made to U.S. Pat. No. 4,195,343.

Test Mode Control Circuits

The hit/miss control circuits 20-42 of FIG. 3 further include the test mode control circuits of block 20-440. These circuits are shown in greater detail in FIG. 4b. In response to signals from predetermined ones of the interface lines of connector 20-24b, the test mode control circuits 20-440 generate control and test signals which are applied as inputs to different portions of memory section 20-1. As seen from FIG. 4b, the test mode control circuits 20-440 include a 2:1 multiplexer selector circuit 20-442, a plurality of inverter circuits 20-444 through 20-450 and an AND gate 20-452 arranged as shown. The selector circuit 20-442 is connected to receive as one set of inputs control signals REPLAC010, CYWRIT010, INTERG000 and ADDRS0110 from controller section 20-2. The other set of inputs are either prewired or received from predetermined ones of the interface lines of connector 20-24b. The signals REPLACA10 through ADDRS0100 are applied as inputs to various circuits within section 20-1.

Enabled multiplexer selector circuit 20-442 selects the source of its output signals as a function of the state of input test mode control signal TEMODE010 which is generated by inverting signal TEMODE100 received from interface connector 20-24b. During normal operation, signal TEMODE010 is a binary ONE. Therefore, the source of signals REPLACA10 through ADDRS0100 is controller section 20-2. However, during testing operations, signal TEMODE010 is forced to a binary ZERO. At that time, the source of signals REPLACA10 and ADDRS0A10 is the prewired binary ZERO and ONE input signals in addition to signals TESTRD010 and TESTWP010 from interface connector 20-24b.

The additional test and control signals TEMODE101, TEMODE000 and ADDRSOA00 are generated by inverter circuits 20-449, 20-450 and 20-444, respectively. AND gate 20-452 generates test signal TESTEN010 by combining signals TEMODE100 and TESTRD000 derived by inverting signal TESTRD010 received by inverter circuit 20-448 from interface connector 20-24b. Cache Address Input Section 20-5

As seen from FIG. 3, section 20-5 includes two sets of D-type tristate registers 20-50 and 20-52. These registers may be constructed using 74S373 chips manufactured by Texas Instruments Corporation.

The registers of block 20-50 are connected to receive address signals from FIFO buffer of controller section 20-2. These address signals have as their source, system bus 15. When enabled by signal ADDRS0A10 being forced to a binary ZERO, the registers 20-50 apply the input address signals as signals ADDR00A10 through ADDR17A10 to their output terminals.

The registers of block 20-52 are connected to receive address signals BAR0300010 through BAR220010 from the address interface lines which comprise interface connector 20-24a. When enabled by signal ADDRS0A00 being forced to a binary ZERO, the registers apply address signals BAR030010 through BAR22010 to their output terminals as signals ADDR00B10 through ADDR17B10. Whenever either signal ADDRS0A10 or signal ADDRS0A00 is forced to a binary ONE, the corresponding set of registers 20-50 and 20-52 are placed in a tristate mode wherein no input signals are applied to their output terminals.

As seen from FIG. 3, the output terminals of each set of registers 20-50 and 20-52 are wire ORed together to produce the 10-bit row and column address signals ADDR00110 through ADDR17110. Since signals ADDRS0A10 and ADDRS0A00 are complementary, only one of the sets of registers 20-50 and 20-52 serve as the source of signals ADDR00110 through ADDR17110. The least significant 10 address bits (column address) corresponding to signals ADDR08300 through ADDR17300 are inverted and applied to round robin counter section 20-80, cache store 20-400 and to cache directory 20-84. The most significant 10 address bits (row address) corresponding to signals ADDR00110 through ADDR07110 are applied to cache directory 20-84 and comparator circuits 20-420 through 20-426, as discussed above.

Directory Section 20-8

As seen from FIG. 3, section 20-8 includes the round robin counter circuits of block 20-80, the directory and cache store write control circuits of block 20-82 and the four-level set associative directory 20-84. The round robin counter circuits of block 20-80 generate a pair of signals ROUND0010 and ROUND1010 which select the next column of cache store 20-400 whose information is to be replaced with new information. The round robin replacement technique employed replaces the least recently replaced location with new information. Briefly, each cache column is managed independently in that the circuits of block 20-80 ascertain which of the four entries of the column is to be allocated a word from a corresponding main memory column. The allocation is carried out by employing a separate counter for each column whose contents point to the next word location in the cache column to be assigned or allocated. As each new word is stored in cache, the counter associated with the cache column is incremented by one in a wraparound fashion so that the fifth in a series of new memory references to the same column replaces the information of first memory reference. Thus, the contents of a cache work location that is the least recently replaced in a column is replaced by information from a memory reference to a word in the corresponding memory column that is not already in cache.

Directory and Cache Write Control Circuits 20-82

Figure 4A:
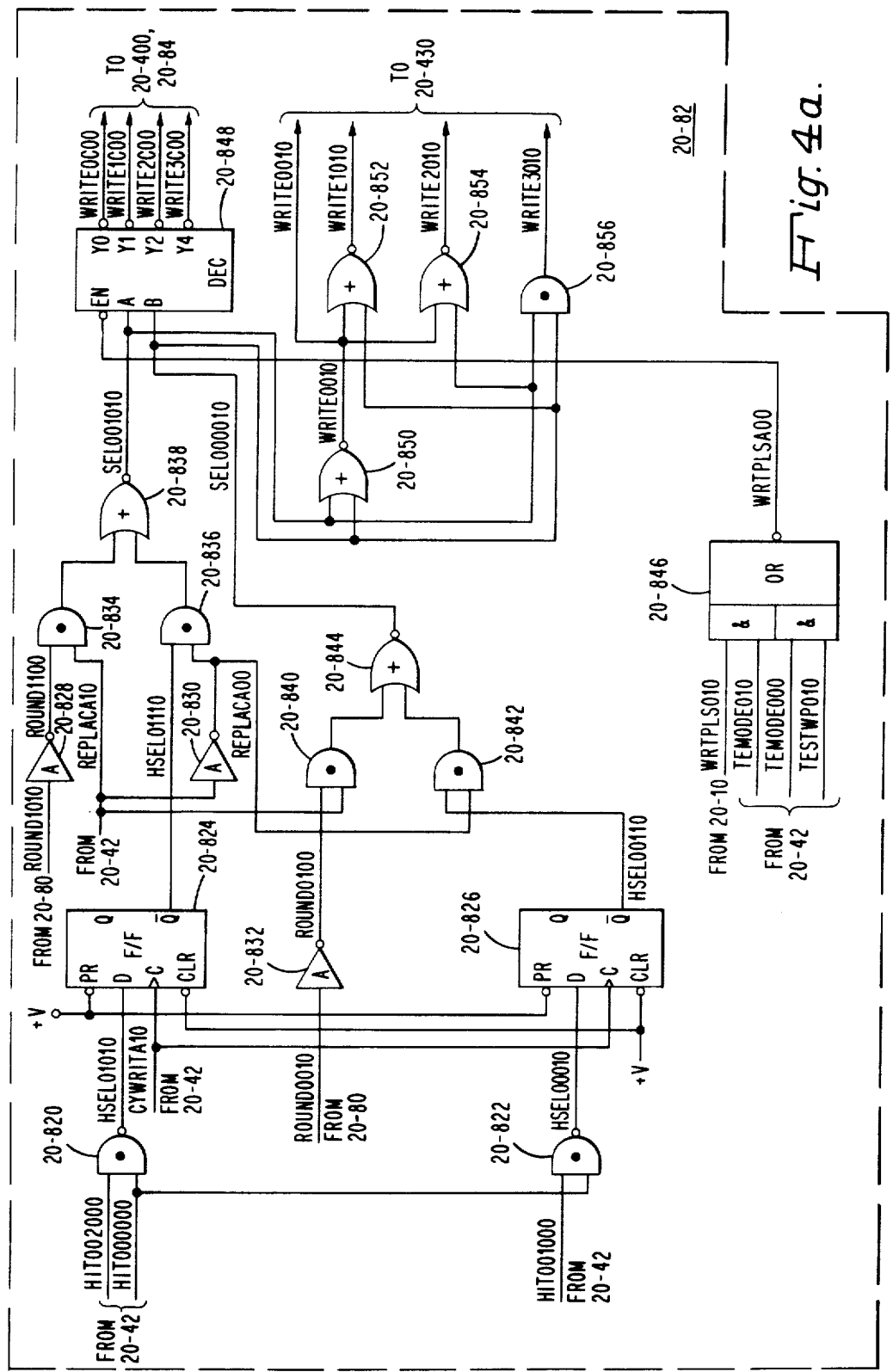
FIGS. 4a and 4b show in greater detail different portions of the cache unit of FIG. 3.

The directory and cache store write control circuits of block 20-82 are shown in greater detail in FIG. 4a. These circuits in response to cache hit signals HIT000000 through HIT002000 from Section 20-4 and round robin signals ROUND0010 and ROUND1010 are operative to generate sets of write signals WRITE0C00 through WRITE3C00 and WRITE0010 through WRITE3010. The signals WRITE0C00 through WRITE3C00 are applied to cache store 20-400 and cache directory 20-84 for enabling data words and row addresses to be written into the specified cache and directory locations during both replacement and write cycles of operations.

In greater detail, the circuits of block 20-82 include a pair of NAND gates 20-820 and 20-822, a pair of D-type flip-flops 20-824 and 20-826, a plurality of inverter circuits 20-828, 20-830 and 20-832, a plurality of AND gates 20-834, 20-836, 20-840, 20-842 and 20-856, a plurality of NOR gates 20-838, 20-844, 20-850 through 20-854, a NAND/NOR gate 20-846, and a decoder circuit 20-848. The NAND gates 20-820 and 20-822 in response to signals HIT000000 through HIT002000 generate hit select signals HSEL01010 and HSEL00010, respectively, for setting D-type flip-flops 20-824 and 20-826. Two sets of AND/NOR gates 20-834, 20-836, 20-838 and 20-840, 20-842, 20-844 combine different ones of the round robin signals ROUND1010, ROUND0100, replacement signals REPLAC010 and REPLAC000 and hit select signals HSEL01110, HSEL00110 to generate select signals SEL001010 and SEL000010 as shown. The signals are decoded by decode circuit 20-848 and result in an appropriate one of the write signals WRITE0C00 through WRITE3C00 being forced to a binary ZERO state in response to write signal WRTPLSA00. Also, signals SEL000010 and SEL001010 are selectively combined within NOR gates 20-850 through 20-854 and AND gate 20-856 for generating corresponding ones of the write signals WRITE0010 through WRITE3010.

In accordance with the present invention, the NAND/NOR gate 20-846 receives write pulse signal WRTPLS010 from controller section 20-2 and signals TEMODE010, TEMODE000 and TESTWP010 from the test mode control circuits of block 20-440. During normal operation, signal TEMODE010 is a binary ONE signal TEMODE000 is a binary ZERO. This permits write pulse signal WRTPLSA00 to be generated as a function of signal WRTPLS010. During testing, signal TEMODE010 is a binary ZERO while signal TEMODE000 is a binary ONE. Now gate 20-846 is conditioned to generate signal WRTPLSA00 under the control of signal TESTWP010.

Cache Directory 20-84

As seen from FIG. 3, each level of the 4-level cache directory includes three RAM chips, each chip containing 1024 by 4 bit locations. Each RAM chip receives column address signals ADDR08300 through ADDR17300 from section 20-5 via the set of inverter circuits 20-54. These signals correspond to the most significant 10 address bits of the main store request address (i.e., bits 0-9). All of the chips of the directory 20-84 are enabled by grounding the chip select terminals (CS) of the chips as indicated in FIG. 3.

Additionally, the three chips of each level receive a corresponding one of the write enable signals WRI- TE0C00 through WRITE3C00 from section 20-82. When anyone of these signals is forced to a binary ZERO, all of the chips of the designated level are enabled for a write operation.

During normal operation, the directory address data to be written into the designated level is inverted and applied via the data in tristate driver circuits of block 20-86 to a corresponding one of sets of data in lines as one of the sets of signals HDAT00A10-HDAT09A10 through HDAT30A10-HDAT39A10. Additionally, parity generator circuits, not shown, generate parity bits for different five bit portions of the row address which are also written into the designated directory level. As seen from FIG. 2, the operation of tristate driver circuits 20-86 are controlled by the state of signal CYWRITA00 from the test mode control circuits of block 20-440. In the preferred embodiment, the tristate driver circuits may be constructed from 74368 chips manufactured by Texas Instruments Corporation.

DESCRIPTION OF OPERATION

With reference to FIGS. 1 through 4b, the operation of the preferred embodiment of the present invention will now be described with reference to the timing diagrams of FIGS. 5 and 6. It is assumed by way of example that the test arrangement shown in FIG. 2 is to be used. In this case, the cache board can be tested prior to being installed in the system of FIG. 1. The single board cache unit 20 receives the required D.C. power supply voltage through the system bus interface connectors of blocks 20-20 and 20-24 of FIG. 2. For simplicity, these connectors have been omitted from FIG. 2.

As discussed earlier, the CPU/test interface 18 includes the various data, address, control and test lines of FIG. 2. A substantial number of these lines are already available for use by CPU 10. The different signals are applied via the connectors Q01, Q02 and Q03 to the different portions of the single board cache unit 20 indicated in FIG. 2. These signals are also applied to a test interface unit 22. The unit 22 includes register and logic circuits used for transmitting and receiving signals to and from interface 18. For the purpose of the present invention, such circuits may be considered conventional in design and may be considered comparable to the interface circuits employed within standard computer systems.

Unit 22 couples to a bus 23 which couples to the automatic test equipment 24. This equipment generates the required address and data patterns for thoroughly exercising cache memory section 20-1. Additionally, it generates the appropriate hit level codes during write operations as explained herein.

This automatic test equipment can be conventional in design and may for example take the form of equipment known as the MACRODATA MD-207/11 memory test system. For further information regarding such equipment, reference may be made to MACRODATA Operations Manual, Document Number 10007881.

As seen from FIG. 2, test interface unit 22 includes a multibit register 22-10 for storing the 20-bit cache address patterns generated by automatic test equipment 24. Each address register pattern is divided into column and row address portions. The low order 10 bits correspond to signals BA0R13010 through BA0R22010. These signals represent the column address which is used for addressing cache store 20-400 and cache directory 20-84 of FIG. 3. The high order 10 bits correspond to signals BAOR03010 through BAOR12010. These signals represent the row address data which is stored in cache directory 20-84.

Additionally, test interface unit 22 includes a conductor circuit 22-12 for forcing cache requests signal CACHRQ010 to a predetermined state which corresponds to ground or binary ZERO. In a similar manner, a further conductor circuit 22-15 forces control signal BAOR00010 to a binary ZERO state. A further multibit hit register 22-14 is used for transmitting and receiving coded hit signals HIT000000 through HIT003000 to and from cache unit 20. A +5 volt source and series connected 1 kilohm load resistor 22-16 included within unit 22 forces test mode signal TEMODE100 to a binary ONE. This places cache unit 20 in a test mode.

As seen from FIG. 2, test interface unit 22 further includes a multibit data register 22-18 for transmitting and receiving data signals including associated parity bit signals to and from cache unit 20. The remaining interface signals are applied as direct inputs to automatic test equipment 24. Obviously, registers in combination with various timing signals may be used for retaining the states of other interface signals as required. It will also be appreciated that the test interface unit 22 also includes other circuits such as timing circuits as required for generating any timing signal required for transmitting and receiving signals from interface 18.

Before testing begins, the entire 4 levels of cache store 20-400 are initialized or loaded with known data patterns by performing series of write test cycles as described herein. This results in directory 20-84 being filled with known row addresses. This operation is carried out in a manner which resembles an initialization operation. This type of operation is described in detail in U.S. Pat. No. 4,190,885.

Once the cache and directory memories have been loaded with known data, the test apparatus of the present invention enables testing to proceed without controller interference. Such testing is accomplished by testing each of the 4 cache store and cache directory levels separately through the performance of read and write test cycles of operation. These cycles may be executed in any order and are executed in a manner as conventionally used to perform standard memory test pattern sequences. Utilizing the apparatus of the present invention, these test operations are carried out as follows.

Cache Memory Test Read Cycle

FIG. 5 illustrates the sequence of signals generated during a test read cycle of operation. It will be appreciated that the test interface unit 22 of FIG. 2 has placed test mode signal TEMODE100 in a binary ONE state. This signal is applied to the test mode control circuits 20-440 of FIG. 4b. When a binary ONE, signal TEMODE100 causes inverter circuit 20-446 to force signal TEMODE010 to a binary ZERO while inverter circuit 20-450 forces signal TEMODE000 to a binary ONE. Also, inverter circuit 20-449 forces signal TEMODE101 to a binary ONE state.

In response to the binary ZERO state signal TEMODE010, selector circuit 20-442 selects the signals applied to its "0" input terminals. Accordingly, the normally generated controller replacement signal REPLACA10 is forced to a binary ZERO. This inhibits the controller section 20-2 from initiating a replacement operation. Also, the normally generated write controller signal CYWRITA10 is generated under the control of test interface unit 22 as a function of test write pulse signal TESTWP010.

Figure 4B:
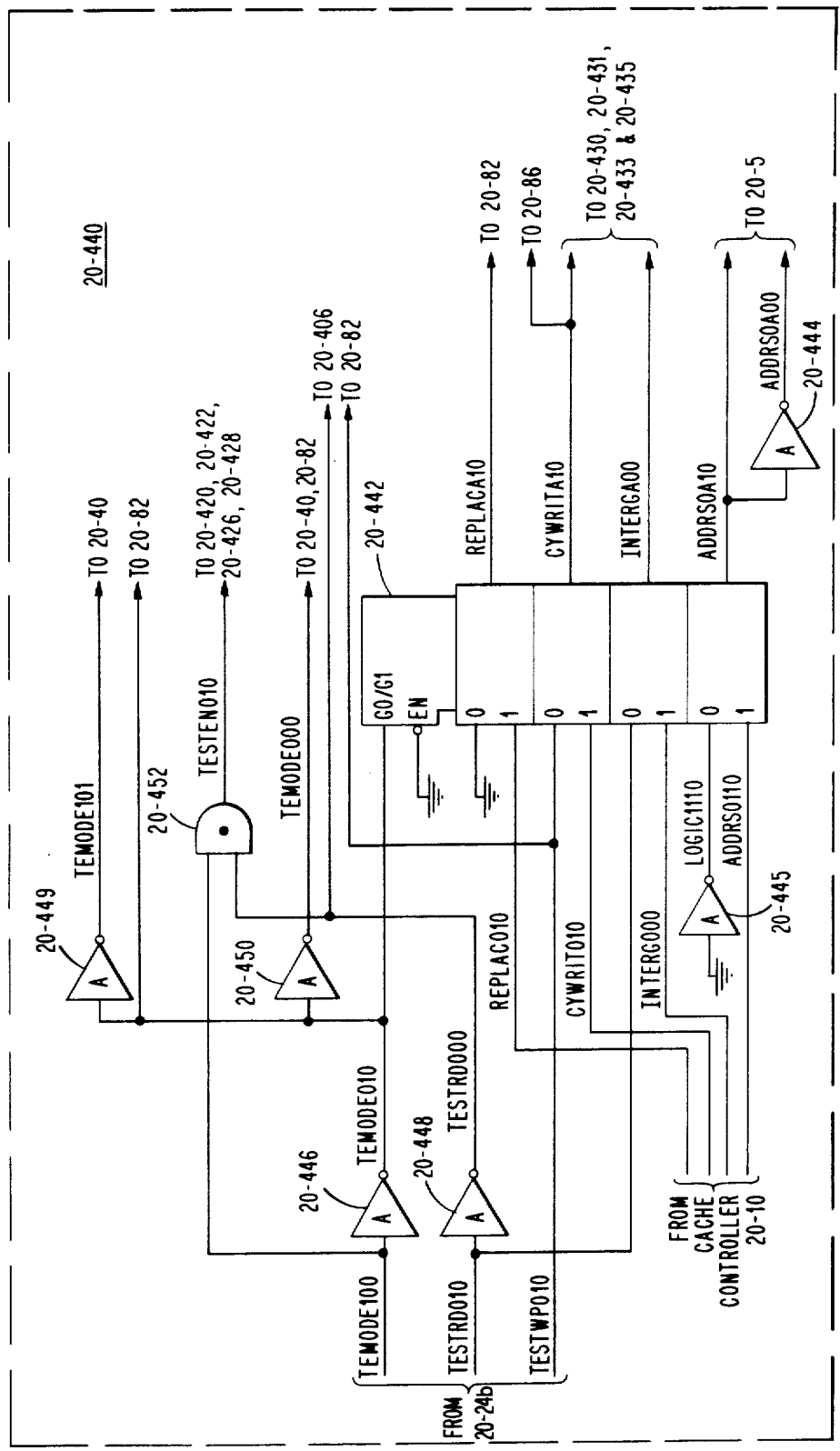

It is also seen from FIG. 4b that normally generated controller signal INTERGA00 now is generated under the control of test interface unit 22 as a function of test read signal TESTRD010. Lastly, normally generated controller address selection signal ADDRSOA10 and its complement signal ADDRSOA00 are forced to predetermined states. That is, signal ADDRSOA10 is forced to a binary ONE while complement signal ADDRSOA00 is forced to a binary ZERO.

The signals REPLACA10 through ADDRSOA00 when applied to various portions of section 20-1 place cache unit 20 in a test mode wherein the section 20-1 can be directly tested without interference from controller section 20-2.

For example, signal REPLACA10 when a binary ZERO enables selection signals SEL000010 and SEL001010 to be generated as a function of the states of flip-flops 20-824 and 20-826. These flip-flops are set in accordance with the states of hit signals HIT000000 through HIT001000 in response to signal CYWRITA10 generated by test interface unit 22. It will also be noted that the write control circuits 20-82 are further conditioned by test signals TEMODE010, TEMODE000 and TESTWP010. The binary ZERO state of signal TEMODE010 inhibits the top AND gate of circuit 20-846. At the same time, the binary ONE state of signal TEMODE000 enables the bottom AND gate to switch the state of write pulse signal WRTPLSA00 as a function of the state of signal TESTWP010.

Also, signal CYWRITA10, applied to the bottom AND gate of each of the circuits 20-430, 20-431, 20-433 and 20-435 enables chip select signals CHIPS0000 through CHIPS3000 to be generated as a function of the state of test write pulse signal TESTWP010, in accordance with the states of write signals WRITE0010 through WRITE3010.

In a similar manner, signal INTERGA00, applied to the top AND gate of each of the circuits 20-430, 20-431, 20-433 and 20-435, enables chip select signals CHIPS0000 through CHIPS3000 to be generated as a function of the state of test read signal TESTRD010, in accordance with the states of hit signals HIT000010 through HIT003010. Additionally, the binary ONE state of signal ADDRSOA10 and the binary ZERO state of signal ADDRSOA00 condition the sets of tristate registers 20-50 and 20-52 so as to enable the states of address signals ADDR00110, the ADDR17110 to be established by the address signals BAOR030010 through BAOR220010, generated by test interface unit 22 applied via connector 20-24a.

That is, signal ADDRSOA10 inhibits the registers 20-50 (i.e., places them in a tristate mode) while signal ADDRSOA00 enables the registers 20-52.

Additionally, it will be noted that the binary ONE state of signal TEMODE000 inhibits the sets of tristate input data registers 20-402 while the binary ONE state of signal TEMODE101 disables multiplexer selector circuit 20-404. The binary ZERO state of signal TEMODE010 enables bidirectional bus transceiver circuits 20-406. Accordingly, circuits 20-406, in accordance with the present invention, operate as an input/output path for transmitting and receiving cache data as a function of the state of test read signal TESTRD000 which establishes the direction of transfer.

Referring to FIG. 5, it is seen that test interface unit 22 forces test read signal TESTRD010 to a binary ZERO while maintaining write pulse signal in a binary ZERO state. Additionally, unit 22 loads address register 22-10 with the desired row and column address values selected to cause a hit to occur in the desired level (e.g. level 0). These signals are applied as signals BAOR03010 through BAOR22010 to section 20-1 of FIG. 3.

As seen from FIG. 4b, when signal TESTRD010 is forced to a binary ONE, inverter circuit 20-448 forces signal TESTRD000 to a binary ZERO. This causes AND gate 20-452 to force test enable signal TESTEN010 to a binary ZERO. As seen from the Figure, signal TESTEN010 when a binary ZERO enables comparator circuits 20-420 through 20-426 for operation.

A short time following the application of address signals BAORO3010 through BAOR22010, the appropriate one of the hit signals (e.g. signal HIT000010) is forced to a binary ONE which, in turn, forces the corresponding chip select signal (e.g. signal CHIPS0000) to a binary ZERO. At that time, the appropriate data from the specified level (e.g. level 0) is read out from the location specified by the column address and applied to the bidirectional transceiver circuits 20-406. Since signal TESTRD000 is a binary ZERO at this time, the circuits 20-406 are conditioned to transfer the data output signals DATA0010 through DATA19010 read from cache store 20-400 to test interface unit 22 via connector 20-24c.

During the test read cycle, the states of hit signals HIT000000 through HIT003000 are applied as inputs to test interface unit 22. Both the hit signals and data signals are loaded into registers 22-14 and 22-18, respectively, for subsequent checking by equipment 24. By checking the data signals and hit signals with known values, automatic test equipment 24 can establish whether or not the cache unit 20 performed the read operation properly. Through the altering of the column address bits, the equipment 24 is able to check the various locations within a particular level and then sequence to the next level, etc.

Cache Memory Test Write Cycle

When the memory bit pattern sequence being executed requires a memory write cycle operation, the equipment 24 operates to enable memory section 20-1 for a test write cycle of operation. FIG. 6 illustrates the sequence of signals generated during a test write cycle of operation. This operation is initiated when the test interface unit 22 forces test read signal TESTRD010 to a binary ZERO. When a binary ZERO, signal TESTRD010 forces signal TESTRD000 to a binary ONE which causes AND gate 20-452 of FIG. 4b to force test enable signal TESTEN010 to a binary ONE. As seen from FIG. 3, signal TESTEN010 when a binary ONE inhibits the operation of comparator circuits 20-420 through 20-426. Also, signal TESTRD000 when a binary ONE conditions the bidirectional transceiver circuits 20-406 to apply data signals CADP000010 through CADP15010 to the input terminals of cache store 20-400.

As seen from FIG. 6, the test interface unit 22 loads the desired pattern of data and address signals into registers 22-18 and 22-10 which are, in turn, applied to cache section 20-1. Also, a very short time later, test interface unit 22 loads hit register 22-14 with a bit pattern coded to specify the level into which the data pattern is to be written. Normally, the levels are selected in the following sequence.

| LEVEL SPECIFIED | LEVEL CODING | | | |
|---|---|---|---|---|
| FOR SELECTION | HIT000 | HIT001 | HIT002 | HIT003 |
| 0 | 0 | 1 | 1 | 1 |
| 1 | 1 | 0 | 1 | 1 |
| 2 | 1 | 1 | 0 | 1 |
| 3 | 1 | 1 | 1 | 0 |

When initially writing into a given level, a dummy write cycle is performed in order to ensure that the hit level pattern has been properly clocked into the hit flip-flops 20-824 and 20-826 of FIG. 4a as discussed herein.

Referring to FIG. 4a, it is seen that the hit level pattern, generated by test interface unit 22, is clocked into flip-flops 20-824 and 20-826 in response to signal CYWRITA10. This signal is forced to a binary ONE when test interface unit 22 forces test write pulse signal TESTWP010 to a binary ONE. As seen from FIG. 6, this occurs shortly after the desired hit level code is applied to section 20-1.

Additionally, signal TESTWP010 causes the bottom AND gate of circuit 20-846 to force signal WRTPLSA00 to a binary ZERO. This, in turn, enables decoder 20-848 to force the appropriate one of the write signals WRITE0C00 through WRITE3C00 to a binary ZERO. Additionally, a corresponding one of the signals WRITE0010 through WRITE3010 is forced to a binary ONE.

The write signal from decoder circuit 20-848 enables the row address (i.e., signals BAOR03010-12010) to be written into the specified level of directory 20-84 at the location specified by the location specified by the column address (i.e., signals BAOR01010-22010). The corresponding one of the signals WRITE0010 through WRITE3010 together with signal CYWRITA10 cause the designated one of the circuits 20-430, 20-431, 20-433 and 20-435 to force the appropriate chip select signal to a binary ZERO.

This results in the input data, generated by test interface unit 22, to be written into the designated level of cache store 20-400 at the location specified by the column address, in response to the write signal generated by decoder circuit 20-848. After a predetermined interval, test write pulse signal TESTWP010 is switched to a binary ZERO by test interface unit 22. At the completion of the write cycle, unit 22 switches test read signal TESTRD010 to a binary ZERO. At that time, unit 22 is able to initiate the next test read or write cycle. Because it takes a certain amount of time to ensure that the outputs of flip-flops 20-824 and 20-826 of FIG. 4a have reached steady state, the first write cycle may not provide selection of the desired level. Therefore, the first cycle after level switching is treated as a dummy cycle.

By performing successive test write and read cycles, the locations within level 0 through level 3 can be thoroughly tested through the use of standard memory bit patterns.

While the above operation of the present invention has been described in terms of testing single board cache unit 20 prior to installation, it will be appreciated that the apparatus of the present invention can also be used to test cache unit 20 when installed in the system of FIG. 1. In this case, it is CPU 10 which performs the function of the automatic test equipment 24 and test interface 23, as shown in the flow chart of FIG. 7.

Figure 7:
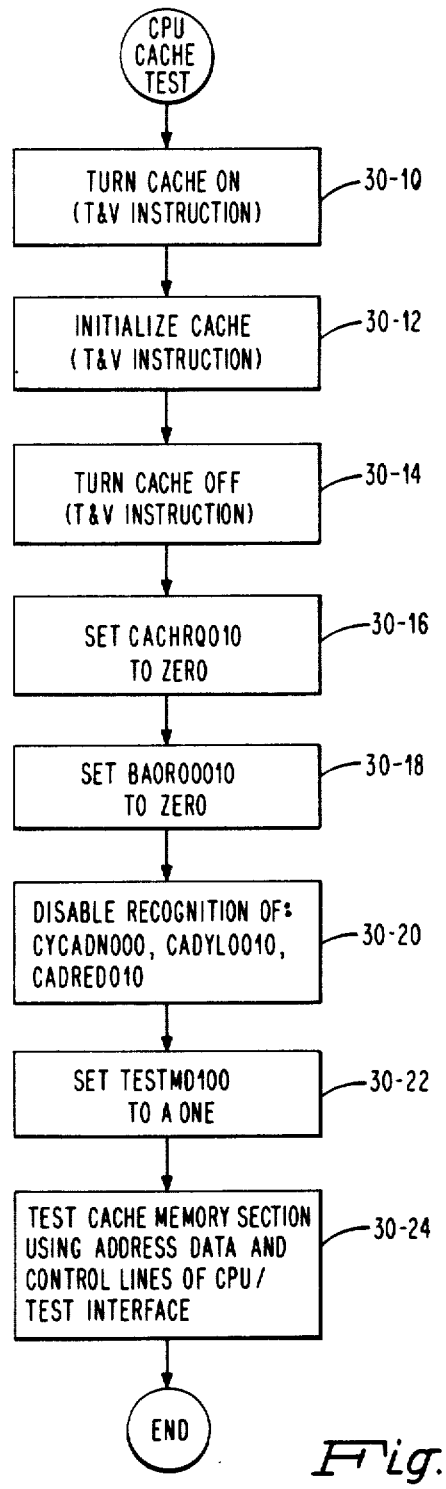
FIG. 7 is a flow chart used in describing the set up operations performed by the central processing unit of FIG. 1 to allow testing of the cache unit in accordance with the apparatus of the present invention.

Referring to the flow chart of FIG. 7, it is seen that the CPU 10 executes a series of set-up operations so as to enable the testing of cache memory system 20-1, in accordance with the apparatus of the present invention. A first step 30-10 performed by CPU 10 is to turn on cache unit 20. This step is performed in response to a first test and verification instruction received by CPU 10 via system bus 15. This allows cache unit 20 to communicate with system bus 15 and main store 12. A next step 30-12 performed by CPU 10 is to initialize cache unit 20. This is accomplished by a test and verification instruction received by CPU 10 via system bus 15. This instruction causes cache unit 20 to be loaded with the contents of locations 0 through 4095 of main store 12.

As indicated by step 30-14, at the completion of the initialization operation, CPU 10 operates to turn off cache unit 20 in response to another test and verification instruction in a similar manner as described above. This inhibits the cache unit 20 from communicating with main store 12 thereby ensuring no interference. For further information regarding such test and verification instructions, reference may be made to U.S. Pat. No. 4,190,885.

As seen from FIG. 7, CPU 10 performs the series of set-ups 30-16 through 30-22. These are carried out in the same manner as described above in connection with test interface 22 and equipment 24. This results in cache memory 20-4 and directory 20-8 being placed in a test mode (i.e., configured for testing) wherein such testing can be carried out without interference from cache controller 20-2. A last step or operation performed by CPU 10 is initiating signals for carrying out operations on cache buffer memory 20-4 and directory memory 20-8. Again, such testing is carried out by CPU 10 using interface 22 in the same manner as described above relative to automatic test equipment 24.

From the foregoing, it is seen how the apparatus of the present invention permits the direct testing of the memory section of a cache unit without cache controller interference. This is accomplished by utilizing the same interface used by the cache for cache/CPU transfers and the addition of a minimal amount of logic circuits which enable the cache unit to be placed in a test mode of operation in which the memory section is isolated from controller operation.

It will be obvious to those skilled in the art that many changes may be made to the preferred embodiment of the present invention without departing from its teachings. For example, the apparatus of the invention may be used with cache units having different organizations in which the memory and controller circuits are contained on a single board or substrate. Also, the invention may be utilized with various types of automated test equipment, test interfaces and central processing units. Other changes which can be made to the preferred embodiment will occur to those skilled in the art.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed:

1. A single board cache unit including a controller section and a memory section, said controller section including circuits for controlling the operations of said cache unit and input/output circuits for transmitting and receiving signals to and from a plurality of lines of an interface which couples said cache unit to a central processing unit of a system when said cache unit board is installed in said system, said cache unit providing high speed access to main memory data in response to requests containing row and column addresses applied to said interface by said central processing unit, said memory section comprising:

cache and directory stores, each organized into a number of levels of storage locations, each location within said cache and directory levels being defined by a different one of said column addresses and each location of said directory store for storing the row address designating which one of said levels stores corresponding data;

bidirectional data transfer means coupled to said cache store and to a first group of said plurality of said interface lines;

input data transfer means coupled to said cache stored and to said controller section, said input data transfer means being conditioned by said controller section during normal operation to apply data received from said controller section to be written into said cache store during write cycles of operation;

output data transfer means coupled to said cache store, to said first group of said plurality of interface lines and to said controller section, said output data transfer means being conditioned by said controller section during normal operation to selectively apply data read out from said cache store and data from said controller section to said first group of said plurality of said interface lines during read cycles of operation; and, test mode control means operatively coupled to said interface, to said bidirectional data transfer means, to said input data transfer means and to said output data transfer means, said test mode control means being operative in response to a first signal applied to a first one of said interface lines to configure said cache unit for testing and during said testing conditioning said input transfer means and said output data transfer means to inhibit normal data transfers to and from said cache store and simultaneously enable said bidirectional data transfer means for transferring data patterns between said cache store and said first group of said plurality of interface lines for said direct testing of said memory section without controller interference.

2. The cahce unit of claim 1 wherein said single board cache unit is uninstalled in said system and said controller input/output circuits being coupled to a plurality of test interface lines of a test interface means, said test interface means being coupled to automatic test apparatus and said test interface means including:

means for applying said first signal to said first one of said test interface lines of configuring said cache unit for testing; and, a plurality of registers for transmitting said row and column addresses and data patterns received from said test apparatus to sets of said test interface lines for said direct testing of said cache and directory stores without controller interference.

3. The cache unit of claim 1 wherein said sigle board cache unit is installed in said system and said central processing unit includes:

means for applying said first signal to said first one of said interface lines for configuring said cache unit for testing; and, means for transmitting said row and column addresses and data patterns to the same sets of lines of said interface used during normal operations for processing requests, for said direct testing of said cache and directory stores when said cache unit is configured for testing.

4. The cache unit of claim 1 wherein said memory section further includes:

an input address section for transferring said row and column addresses to said directory and cache stores in response to said requests, said input address section including:

first register means coupled to said controller section, to said cache and directory stores and to said test mode control means; and, second register means coupled to a second group of said plurality interface lines, to said cache and directory stores and to said test mode control means;

said test mode control means during said testing conditioning said first and second register means to inhibit the transfer of said row and column addresses from said controller section and to enable the transfer of said row and column addresses from said interface for said direct testing of said memory section.

5. The cache unit of claim 1 wherein said memory section further includes:

write control means coupled to said cache and directory stores and to said test mode control means, said write control means being operative during normal operation to generate write control signals in response to write pulse signals from said controller section enabling addresses and data to be written into storage locations of said cache and directory stores;

comparison means coupled to said write control means, to said directory store, to said test mode control means, and to other predetermined ones of said interface lines, said comparison means during normal operation comparing the row addresses read out from said directory store with the row address of each request and generating hit signals used for subsequently enabling of said cache store for operation when said hit signals indicate that the data specified by said requests are stored in said cache store; and, said test mode control means transferring control of said write control means and said comparison means from said controller section to said interface, said interface applying signals to predetermined ones of said interface lines for conditioning said write control means and said comparison means during test write cycles of operation to write data patterns into levels of said cache store selected by coded signals applied to other predetermined ones of said interface lines and for conditioning said write control means and said comparison means during test read cycles of operation to read out data patterns stored in said cache store during previous test write cycles of operation and enable the transfer of said hit signals generated by said comparison means to said other predetermined lines of said interface as required for said direct testing of said memory section.

6. The cache unit of claim 5 wherein said memory section further includes:
- selection means coupled to said comparison means, to said write control means, to said test mode control means and to said cache store, said selection means being operative during read and write cycles of operation in response to said hit signals and said write signals respectively to enable said cache store levels for reading and writing during normal operation, said test mode control means during said testing conditioning said selection means to enable said cache levels as a function of the signals applied to said certain ones of said interface lines.

7. The cache unit of claim 6 wherein said test mode control means includes:
- selector means, said selector means having:
    - input control means coupled to said first one of said interface lines;
    - a first plurality of input means being coupled to receive control signals from said controller section for conditioning said memory section during normal operation to perform read and write cycles of operation;
    - a second plurality of input means, predetermined ones of said plurality of input means being coupled to certain ones of said interface lines; and
    - a plurality of output means, certain ones of said output means being coupled to said selection means, to said write control means, said bidirectional data transfer means, said input data transfer means and to said output data transfer means, said selector means being conditioned by said first signal applied to said input control means to switch control from said first plurality of input means to said second plurality of input means so as to condition said memory section to perform test read and write cycles of operation in response to signals applied to said certain ones of said interface lines.

8. The cache unit of claim 7 wherein said first one of said interface lines is connected to be placed in a predetermined state defining the configuration of said cache unit for testing and wherein certain ones of said interface lines coupled to said selector means includes a first control line connected to receive a test write pulse signal for defining the start of each test write cycle of operation and a second control line connected to receive a bilevel control signal coded to define the type of test cycles of operation to be performed by said memory section.

9. The cache unit of claim 8 wherein a first one of said second plurality of input means of said selector means connects to a predetermined reference potential and a corresponding one of said plurality of output means couples to said write control means, said corresponding one of said plurality of output means applying said predetermined reference potential to said write control means during said testing to inhibit said memory section from performing replacement operations under the control of said controller section.

10. The cache unit of claim 9 wherein said write control means includes write control gating means coupled to said controller section for receiving a write control pulse defining the start of a memory write cycle of operation and to said test mode control means for receiving signals from said first one of said interface lines and said test write pulse signal from said first control line, said write control gating means logically combining said signals to generate an output write pulse signal as a function of said test write pulse signal during said testing.

11. The cache unit of claim 9 wherein said memory section further includes:
- an input address section for transferring said row and column addresses to said directory and cache stores in response to said requests, said section including:
    - first register means coupled to said controller section, to said cache and directory stores and to said test mode selector means; and
    - second register means coupled to a second one of said sets of said interface lines, to said cache and directory stores and to said test mode selector means; and
- wherein a second one of said second plurality of input means of said selector means connects to a predetermined reference voltage and a corresponding one of said plurality of output means couples to said first and second register means, said corresponding one of said plurality of output means applying said predetermined reference voltage and the complement of said predetermined reference voltage to first and second register means respectively for enabling the transfer of said row and column addresses from said second one of said sets of interface lines for said direct testing of said memory section.

12. A cache unit constructed on a single board, said cache unit being divided into a controller section and a memory section, said controller section including circuits for controlling the operations of said cache unit and interface input/output connection circuits for transmitting and receiving signals to and from sets of address, data and control lines of an interface normally used to couple said cache unit to a central processing unit of a minicomputer system for providing high speed access to main memory data in response to requests containing row and column addresses applied to said set of address lines by said central processing unit, said memory section comprising:
- a cache store organized into a number of levels of storage locations, each location being defined by a different column address, said cache store being operatively coupled to said interface connection circuits connectable to said sets of address and data lines;
- a directory store being organized into the same number of levels of storage locations as in said cache store, each location of said directory store for storing the row address designating which one of said levels stores corresponding data and each different location within said levels being defined by a different one of said column addresses;
- write control means coupled to said cache and directory stores, said write control means being operative to generate write control signals in response to write pulse signals from said controller section enabling address and data to be written into storage locations of said cache and directory stores;
- comparison and selection means coupled to said write control means, to said director store and to said interface connection circuits connectable to a first plurality of said set of control lines for receiving signals generated by said comparison and selection means, said comparison means comparing the row addresses read out from said directory store with the row address of each request and generating said signals for enabling corresponding ones of said cache store levels for operation when the data requested is stored in said cache store; and, test mode control means operatively coupled to said controller interface connection circuits connectable to a second plurality of said set of control lines, to said cache and directory stores, to said comparison and selection means and to said write control means, said test mode control means including:

control means coupled to predetermined ones of said second plurality of said set of control lines to receive control signals from said controller section for conditioning said memory section for performing read and write operations within said cache and directory stores under control of said comparison and selection means and said write control means, said control means being conditioned by a signal applied to a first one of said second plurality of control lines to configure said cache unit for testing by enabling said cache and directory stores for direct testing through said interface connection circuits connected to said sets of address, control and data normally used by said central processing unit.

13. The cache unit of claim 12 wherein said single board cache unit is uninstalled in said system and said controller input/output circuits connect to a plurality of test interface lines of test interface means, said test interface means being coupled to automatic test apparatus and said test interface means including:

means for applying said first signal to said first one of said second plurality of control lines for configuring said cache unit for testing; and, a plurality of registers for transmitting said row and column addresses and data patterns received from said test apparatus to sets of said plurality of said test interface lines for said direct testing of said cache and directory stores without controller interference.

14. The cache unit of claim 12 wherein said single board cache unit is installed in said system and interface connection circuits connected to said sets of address data and control lines which couple to said central processing unit, said central processing unit including:

means for applying said first signal to said first one of said second plurality of control lines for configuring said cache unit for testing; and, means for transmitting said row and column addresses and data patterns to said sets of address and data lines for said direct testing of said cache and directory stores when said cache unit is being tested.

15. The cache unit of claim 12 wherein said memory section further includes:

bidirectional data transfer means coupled to said cache store, to those interface connection circuits which are connectable to said set of data lines and to said test mode control means;

input data transfer means coupled to said cache store, to said controller section and to said test mode control means, said input data transfer means being conditioned by said controller section during normal operation to apply data received from said controller section to be written into said cache store during write cycles of operation;

output data transfer means coupled to said cache store, to those interface connection circuits which are connectable to said set of data lines, to said controller section and to said test mode control means, said output data transfer means being conditioned by said controller section during normal operation to selectively apply data read out from said cache store and data from said controller section to said set of data lines during read cycles of operation; and, said test mode control means during said testing conditioning said input data transfer means and said output data transfer means to inhibit normal data transfers to and from said cache store and simultaneously enabling said bidirectional data transfer means for transferring data patterns between said cache store and said set of data lines for said direct testing of said memory section.

16. The cache unit of claim 15 wherein said memory section further includes:

an input address section for transferring said row and column addresses to said directory and cache stores in response to said requests, said input address section including:

first register means coupled to said controller section, to said cache and directory stores and to said test mode control means; and, second register means coupled to those interface circuits which are connectable to said set of address lines, to said cache and directory stores and to said test mode control means;

said test mode control means during said testing conditioning said first and second register means to inhibit the transfer of said row and column addresses from said controller section and to enable the transfer of said row and column addresses from said set of address lines for said direct testing of said memory section.

17. The cache unit of claim 15 wherein said test mode control means includes:

selector means, said selector means having:

input control means coupled to said first one of said second plurality of control lines;

a first plurality of input means being coupled to receive control signals from said controller section for conditioning said memory section during normal operation to perform read and write cycles of operation;

a second plurality of input means coupled to said second plurality of said control lines; and a plurality of output means, certain ones of said output means being coupled to said selection means, to said write control means, said bidirectional data transfer means, said input data transfer means and to said output data transfer means, said selector means being conditioned by said first signal applied to said input control means to switch control from said first plurality of input means to said second plurality of input means so as to condition said memory section to perform test read and write cycles of operation in response to signals applied to other ones of said second plurality of control lines.

18. The cache unit of claim 17 wherein said first one of said second plurality of control lines is connected to be placed in a predetermined state defining the configuration of said cache unit for testing said test mode of operation and wherein said other ones of said second plurality of control lines couple to said selector means includes a first control line connected to receive a test write pulse signal for defining the start of each test write cycle of operation and a second control line connected to receive a bilevel control signal coded to define the type of test cycles of operation to be performed by said memory section.

19. The cache unit of claim 18 wherein a first one of said second plurality of input means of said selector means connects to a predetermined reference potential and a corresponding one of said plurality of output means couples to said write control means, said corresponding one of said plurality of output means applying said predetermined reference potential to said write control measns during said testing to inhibit said memory section from performing replacement operations under the control of said controller section.

20. The cache unit of claim 19 wherein said write control means includes write control gating means coupled to said controller section for receiving a write control pulse defining the start of a memory write cycle of operation and to said test mode control means for receiving signals from said first one of said second plurality of control lines and said test write pulse signal from said first control line, said write control gating means logically combining said signals to generate an output write pulse signal as a function of said test write pulse signal during said testing.

21. The cache unit of claim 19 wherein said memory section further includes:
an input address section for transferring said row and column addresses to said directory and cache stores in response to said requests, said section including:
first register means coupled to said controller section, to said cache and directory stores and to said test mode selector means; and
second register means coupled to the interface circuits which are connectable to said set of address lines, to said cache and directory stores and to said test mode selector means; and
wherein a second one of said second plurality of input means of said selector means connects to a predetermined reference voltage and a corresponding one of said plurality of output means couples to said first and second register means, said corresponding one of said plurality of output means applying said predetermined reference voltage and the complement of said predetermined reference voltage to first and second register means respectively for enabling the transfer of said row and column addresses from said set of address lines for said direct testing of said memory section.

22. Test apparatus for testing a single board cache unit including a controller section and a memory section, said controller section including circuits for controlling the operations of said cache unit and interface connector circuits connectable for transmitting and receiving signals to and from an interface including an address, data and control buses normally used to couple said cache unit to a central processing unit and said memory section including:
cache and directory stores, each organized into a number of levels of storage locations, each location within said cache and directory levels being defined by a different column address and each location of said directory store for storing a row address designating which one of said cache levels stores the corresponding data;
write control means coupled to said cache and directory stores, said write control means being operative to generate write control signals in response to write pulse signals from said controller section enabling address and data to be written into storage locations of said cache and directory stores;
comparison and selection means coupled to said write control means to said directory store and to said interface connector circuits, said comparison means comparing the row addresses read out from said directory store with the row address of each request and generating signals for enabling said cache store for operation when the data requested is stored in said cache store; and,
said test apparatus comprising:
bidirectional data transfer means coupled to said cache store and to the connector circuits which are connectable to said data bus;
means for coupling said comparison and selection means to the interface connector circuits which are connectable to a first plurality of lines of said control bus; and,
test mode control means coupled to said controller section, to said write control means, to said cache and directory stores, to said bidirectional data transfer means, to said comparison and selection means and to the interface connector circuits which are connectable to a second plurality of lines of said control bus, said test mode control means being conditioned by a signal applied to a first one of said second plurality of control bus lines to switch to a test mode of operation, said test control means when in said test mode configuring said cache unit for testing by conditioning said cache and directory stores, said comparison and selection means, said write control means and bidirectional data transfer means to perform test read and write cycles of operation upon storage locations specified by row and column addresses applied to said address bus with data patterns applied to said data bus in response to signals applied to said second plurality of control bus lines for the direct testing of said memory section without controller interference by said test apparatus.

23. The test apparatus of claim 22 wherein said single board cache unit is uninstalled in said system and said test apparatus further includes:
automatic test apparatus;
a plurality of sets of address, data and control lines connected to said interface connector circuits; and,
test interface means coupled to said plurality of sets of address, data and control lines and to said automatic test apparatus, said test interface means including:
means for applying said first signal to said firts one of said second plurality of control bus lines for configuring said cache unit for testing; and,
a plurality of registers for transmitting said row and column addresses and data patterns received from said test apparatus to said sets of address and data lines for said direct testing of said cache and directory stores without controller interference.

24. The apparatus of claim 22 wherein said single board cache unit is installed in said system and said interface circuits connect to said address, data and control buses connected to said central processing unit and said central processing unit includes:
  means for applying said first signal to said first one of said second plurality of control bus lines for configuring said cache unit for testing; and,
  means for transmitting said row and column addresses and data patterns to said address and data buses for said direct testing of said cache and directory stores when said cache unit is being tested.

25. The test apparatus of claim 22 wherein said memory section further includes:
  input data transfer means coupled to said cache store, to said controller section and to said test mode control means, said input data transfer means being conditioned by said controller section during normal operation to apply data received from said controller section to be written into said cache store during write cycles of operation; and,
  output data transfer means coupled to said cache store, to said data bus, to said controller section and to said test mode control means, said output data transfer means being conditioned by said controller section during normal operation to selectively apply data read out from said cache store and data from said controller section to said data bus during read cycles of operation; and,
  said test mode control means when in said test mode conditioning said input data transfer means and said output data transfer means to inhibit normal data transfers to and from said cache store during the simultaneously enabling of said bidirectional data transfer means for transferring data patterns between said cache store and said data bus for said direct testing of said memory section.

26. The test apparatus of claim 22 wherein said test mode control means includes:
  selector means, said selector means having:
    input control means coupled to said first one of said control bus lines;
    a first plurality of input means being coupled to receive control signals from said controller section for conditioning said memory section during normal operation to perform read and write cycles of operation;
    a second plurality of input means, predetermined ones of said plurality of input means being coupled to certain ones of said control bus lines; and
    a plurality of output means, certain ones of said output means being coupled to said selection means, to said write control means, said bidirectional data transfer means, to said input data transfer means and to said output data transfer means, said selector means being conditioned by said first signal applied to said input control means to switch control from said first plurality of input means to said second plurality of input means so as to condition said memory section to perform test read and write cycles of operation in response to signals applied to said certain ones of said control bus lines.

27. The test apparatus of claim 26 wherein said first one of said control bus lines is connected to be placed in a predetermined state defining said test mode of operation and wherein certain ones of said control bus lines coupled to said selector means includes a first control line connected to receive a test write pulse signal for defining the start of each test write cycle of operation and a second control line connected to receive a bilevel control signal coded to define the type of test cycles of operation to be performed by said memory section.

28. The test apparatus of claim 27 wherein a first one of said second plurality of input means of said selector means connects to a predetermined reference potential and a corresponding one of said plurality of output means couples to said write control means, said corresponding one of said plurality of output means applying said predetermined reference potential to said write control means during said test mode to inhibit said memory section from performing replacement operations under the control of said controller section.

29. The test apparatus of claim 28 wherein said write control means includes write control gating means coupled to said controller section for receiving a write control pulse defining the start of a memory write cycle of operation and to said test mode control means for receiving signals from said first one of said control bus lines and said test write pulse signal from said first control line, said write control gating means logically combining said signals to generate an output write pulse signal as a function of said test write pulse signal during said testing.

30. The test apparatus of claim 28 wherein said memory section further includes:
  an input address section for transferring said row and column addresses to said directory and cache stores in response to said requests, said section including:
  first register means coupled to said controller section, to said cache and directory stores and to said test mode selector means; and
  second register means coupled to said address bus, to said cache and directory stores and to said test mode selector means; and
    wherein a second one of said second plurality of input means of said selector means connects to a predetermined reference voltage and a corresponding one of said plurality of output means couples to said first and second register means, said corresponding one of said plurality of output means applying said predetermined reference voltage and the complement of said predetermined reference voltage to first and second register means respectively for enabling the transfer of said row and column addresses from said address bus for said direct testing of said memory section.

31. The test apparatus of claim 24 wherein said controller section includes means in response to a sequence of test and verification instructions to initialize said cache and directory stores with test address and data patterns and for enabling subsequent testing of said cache and directory stores without controller interference.

* * * * *